United States Patent
Chen

(10) Patent No.: US 7,929,366 B2
(45) Date of Patent: Apr. 19, 2011

(54) TEMPERATURE DETECTOR IN AN INTEGRATED CIRCUIT

(75) Inventor: Chung Zen Chen, Hsinchu (TW)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 12/619,157

(22) Filed: Nov. 16, 2009

(65) Prior Publication Data

US 2010/0061172 A1  Mar. 11, 2010

Related U.S. Application Data

(63) Continuation of application No. 11/932,451, filed on Oct. 31, 2007, now Pat. No. 7,630,267.

(51) Int. Cl.
*G11C 7/04* (2006.01)
(52) U.S. Cl. ............ 365/211; 365/233.1; 365/233.11; 365/233.12; 365/194
(58) Field of Classification Search .......... 365/211, 365/233.1, 233.11, 233.12
See application file for complete search history.

(56) References Cited

U.S. PATENT DOCUMENTS

| | | | |
|---|---|---|---|
| 5,691,661 A | 11/1997 | Fukuda et al. | |
| 2002/0133789 A1 | 9/2002 | Hsu et al. | |
| 2003/0155903 A1* | 8/2003 | Gauthier et al. | 324/76.41 |
| 2005/0071705 A1* | 3/2005 | Bruno et al. | 713/500 |
| 2005/0253661 A1* | 11/2005 | Lee | 331/185 |
| 2006/0044910 A1* | 3/2006 | Chang | 365/222 |
| 2006/0140037 A1 | 6/2006 | Lovett | |
| 2007/0036017 A1 | 2/2007 | Seo | |
| 2008/0084249 A1* | 4/2008 | Noguchi | 331/66 |

OTHER PUBLICATIONS

Non-Final Office Action for U.S. Appl. No. 11/932,451 dated Apr. 17, 2009; 11 pages.
Notice of Allowance for U.S. Appl. No. 11/932,451 dated Sep. 30, 2009; 9 pages.

* cited by examiner

*Primary Examiner* — Vu A Le
*Assistant Examiner* — Han Yang
(74) *Attorney, Agent, or Firm* — Guerin & Rodriguez LLP

(57) ABSTRACT

A temperature detector in an integrated circuit comprises a temperature-dependent voltage generator, a ring oscillator, a timer and a clock-driven recorder. The temperature-dependent voltage generator is configured to generate at least one temperature-dependent voltage. The ring oscillator is configured to generate a clock signal, which is affected by one of the at least one temperature-dependent voltage. The timer is configured to generate a time-out signal, which is affected by one of the temperature-dependent voltage. The clock-driven recorder has a clock input terminal in response to the clock signal and time-out signal.

20 Claims, 7 Drawing Sheets

ID CIRCUIT

CROSS-REFERENCE TO RELATED APPLICATION

This application is a continuation application claiming priority to co-pending U.S. patent application Ser. No. 11/932,451, filed Oct. 31, 2007, entitled "Temperature Detector in an Integrated Circuit," the entirety of which U.S. patent application is incorporated by reference herein.

BACKGROUND OF THE INVENTION

1. Field of the Invention

The present invention relates to a temperature detector in an integrated circuit, and more particularly, to a highly sensitive temperature detector in an integrated circuit.

2. Description of the Related Art

Under certain circumstances, it is important to know the current temperature of an integrated circuit (IC) so as to respond accordingly. For example, a dynamic random access memory (DRAM) requires a refresh action at given times so as to maintain the data stored in the memory cells. The higher the ambient temperature, the more often the refresh action has to be performed because the leakage current of the memory cells is proportional to the ambient temperature. If a DRAM is not installed with a temperature detector, it has to operate at the fastest rate even at a cooler temperature to ensure correct operations, thus wasting power.

U.S. Pat. No. 5,691,661 discloses a pulse signal generating circuit including a ring oscillator and an internal voltage generating circuit. The internal voltage is low at a normal temperature and high at a high temperature. The inverters in the ring oscillator are driven by the internal voltage from the internal voltage generating circuit. As a result, the period of a pulse signal increases at a normal temperature, and decreases at a high temperature. Although U.S. Pat. No. 5,691,661 discloses a temperature detector in DRAM, its temperature-sensing mechanism is not accurate enough to satisfy the need to reduce power consumption in modern IC designs.

US 2006/0140037 A1 discloses an oscillator generating a temperature variable signal that has a frequency proportional to the ambient temperature. By means of a temperature invariant oscillator and an n-bit counter, the ambient temperature can be estimated. In other words, the faster the counter counts, the larger the count value at the end of a sense cycle initiated by the temperature invariant oscillator. A larger count value indicates a warmer temperature, and a smaller count value indicates a colder temperature. The disadvantage of US 2006/0140037 A1 is that the temperature reading is not accurate enough.

SUMMARY OF THE INVENTION

The above-mentioned problems are addressed by the present invention. The structure and method of the present invention will be understood according to the disclosure of the following specification and drawings.

According to one embodiment of the present invention, the temperature detector in an integrated circuit comprises a temperature-dependent voltage generator, a ring oscillator, a timer and a clock-driven recorder. The temperature-dependent voltage generator is configured to generate at least one temperature-dependent voltage. The ring oscillator is configured to generate a clock signal, which is affected by one of the at least one temperature-dependent voltage. The timer is configured to generate a time-out signal, which is affected by one of the temperature-dependent voltage. The clock-driven recorder has a clock input terminal in response to the clock signal and time-out signal.

According to one embodiment of the present invention, a dynamic random access memory (DRAM) comprises a memory array, a memory controller and a temperature detector. The memory array has a plurality of memory cells. The memory controller provides a refresh signal to maintain the content of the memory cells. The temperature detector is used to determine the rate of the refresh signal.

According to one embodiment of the present invention, a temperature-compensated charge pump in an integrated circuit comprises a temperature-dependent voltage generator, a ring oscillator and a charge pump. The temperature-dependent voltage generator is configured to generate at least one temperature-dependent voltage. The ring oscillator is configured to generate a clock signal, which is affected by one of the at least one temperature-dependent voltage. The charge pump is affected by one of the at least one temperature-dependent voltage and the clock signal.

BRIEF DESCRIPTION OF THE DRAWINGS

The invention will be described according to the appended drawings in which.

DETAILED DESCRIPTION OF THE INVENTION

Figure 1A:
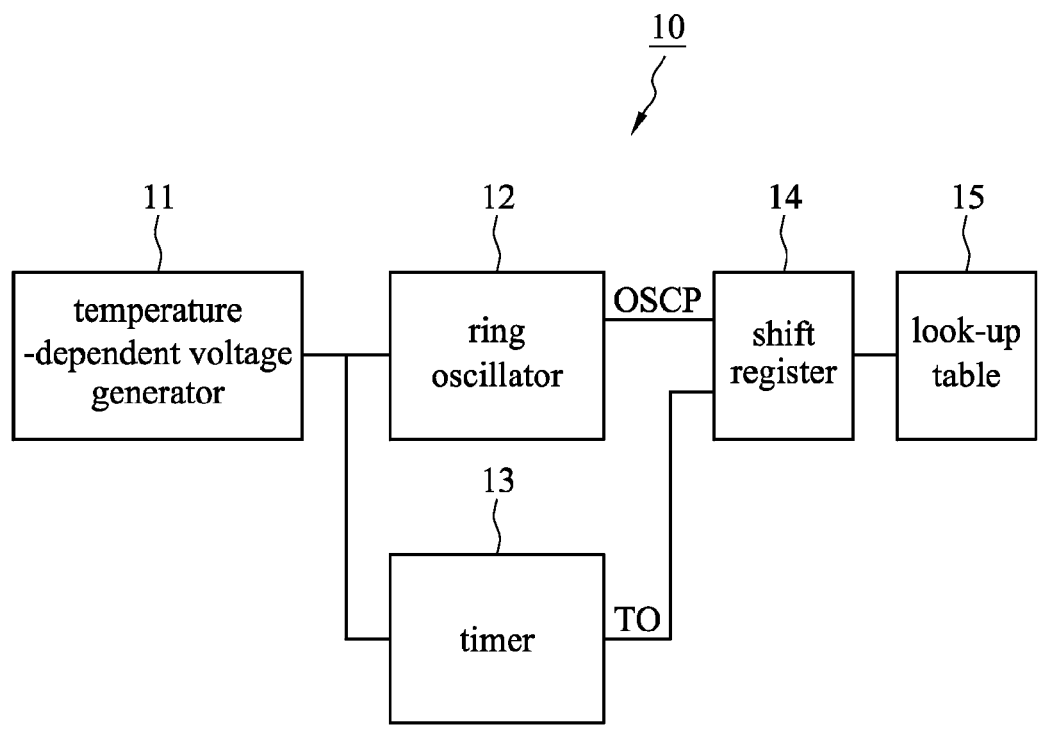
FIGS. 1(a) and 1(b) show temperature detectors in an integrated circuit in accordance with one embodiment of the present invention.
Figure 1B:
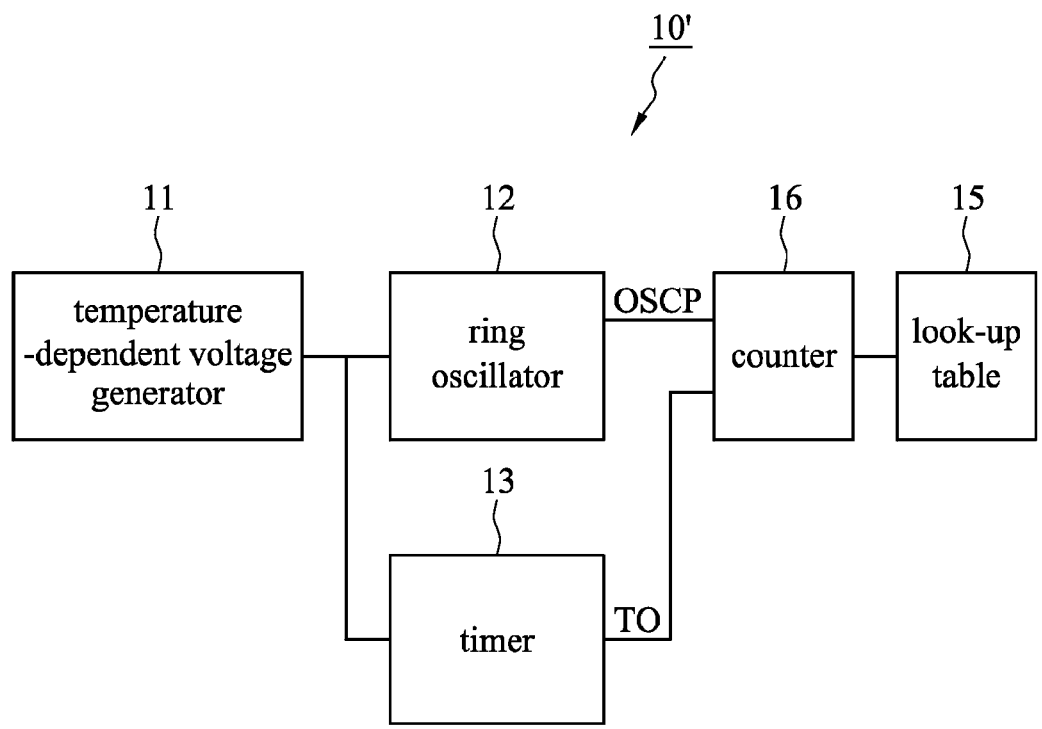

FIG. 1(a) shows a temperature detector in an integrated circuit in accordance with one embodiment of the present invention. The temperature detector 10 includes a temperature-dependent voltage generator 11, a ring oscillator 12, a timer 13, a shift register 14 and a look-up table 15. The temperature-dependent voltage generator 11 is used to generate at least one temperature-dependent voltage. The ring oscillator 12 is configured to generate a clock signal OSCP, which is affected by the at least one temperature-dependent voltage. The timer 13 is configured to generate a time-out signal TO, which is affected by one of the temperature-dependent voltage. The shift register 14 has a clock input terminal in response to the clock signal OSCP and time-out signal TO. The look-up table 15 is used to decode an accurate ambient temperature in accordance with the content of the shift register 14. The look-up table 15 may be omitted if there are other easy ways to decode the content of the shift register 14. FIG. 1(b) shows a temperature detector 10' in an integrated circuit in accordance with another embodiment of the present invention. The difference between it and the structure in FIG. 1(a) is that the shift register 14 is replaced by a counter 16.

No matter it is the shift register 14 or the counter 16 that is selected, they are both clock-driven recorders which accumulate the number of input clocks. Please note that because the ring oscillator 12 and timer 13 are affected by the temperature-dependent voltage generated by the temperature-dependent voltage generator 11, the ring oscillator 12 and timer 13 are both temperature variable elements.

Figure 2:
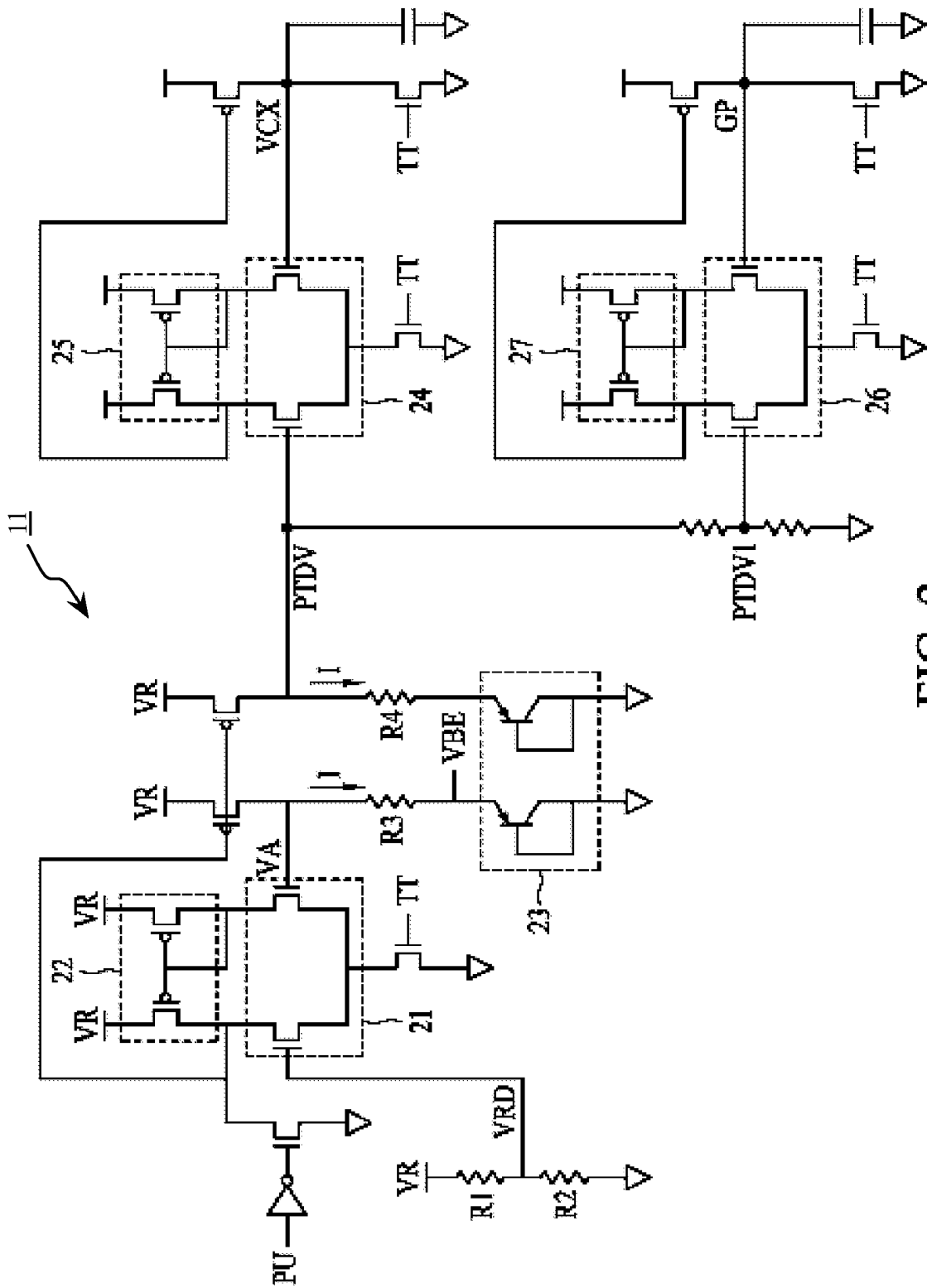
FIG. 2 shows an exemplary circuit of the temperature-dependent voltage generator.

FIG. 2 shows an exemplary circuit of the temperature-dependent voltage generator 11. The voltage source VA is a temperature-independent voltage. The two input ends of the differential amplifier 21, VA and VRD, have the same voltage. A bipolar transistor pair 23 includes two bipolar transistors having the same size and having their collectors coupled to their bases. Therefore the current flowing through the resistor R3 is the same as the current flowing through the resistor R4. Alternatively, a single resistor can be used to replace the resistors R3 and R4, and then connected to a single transistor which is used to replace the bipolar transistor pair 23.

$$VA = VRD = \frac{R2}{R1 + R2} \times VR,$$

which is a constant.

$$\begin{aligned}PTDV &= VBE + I \times R4 \\ &= VBE + I \times R3 + I \times (R4 - R3) \\ &= VA + I \times (R4 - R3) \\ &= VA + \frac{VA - VBE}{R3} \times (R4 - R3) \\ &= \frac{R4}{R3} \times VA - \left(\frac{R4}{R3} - 1\right) \times VBE\end{aligned}$$

Because $$\frac{R4}{R3} \times VA$$

is constant, the signal PTDV varies as $$\left(\frac{R4}{R3} - 1\right) \times VBE$$

varies. The voltage VBE, which represents the base-emitter voltage of the bipolar transistor pair 23, is adversely proportional to the ambient temperature. In other words, the signal PTDV is proportional to the ambient temperature, and the parameter $$\frac{R4}{R3}$$

can be used to adjust the factor of temperature variance to the signal PTDV. The two input ends of the differential amplifier 24, PTDV and VCX, have the same voltage. Because the signal PTDV is proportional to the ambient temperature, so is the signal VCX. The two input ends of the differential amplifier 26 and the signal PTDV1, which is divided by the signal PTDV and GP, have the same voltage. Because the signal PTDV is proportional to the ambient temperature, so is the signal GP.

Figure 3:
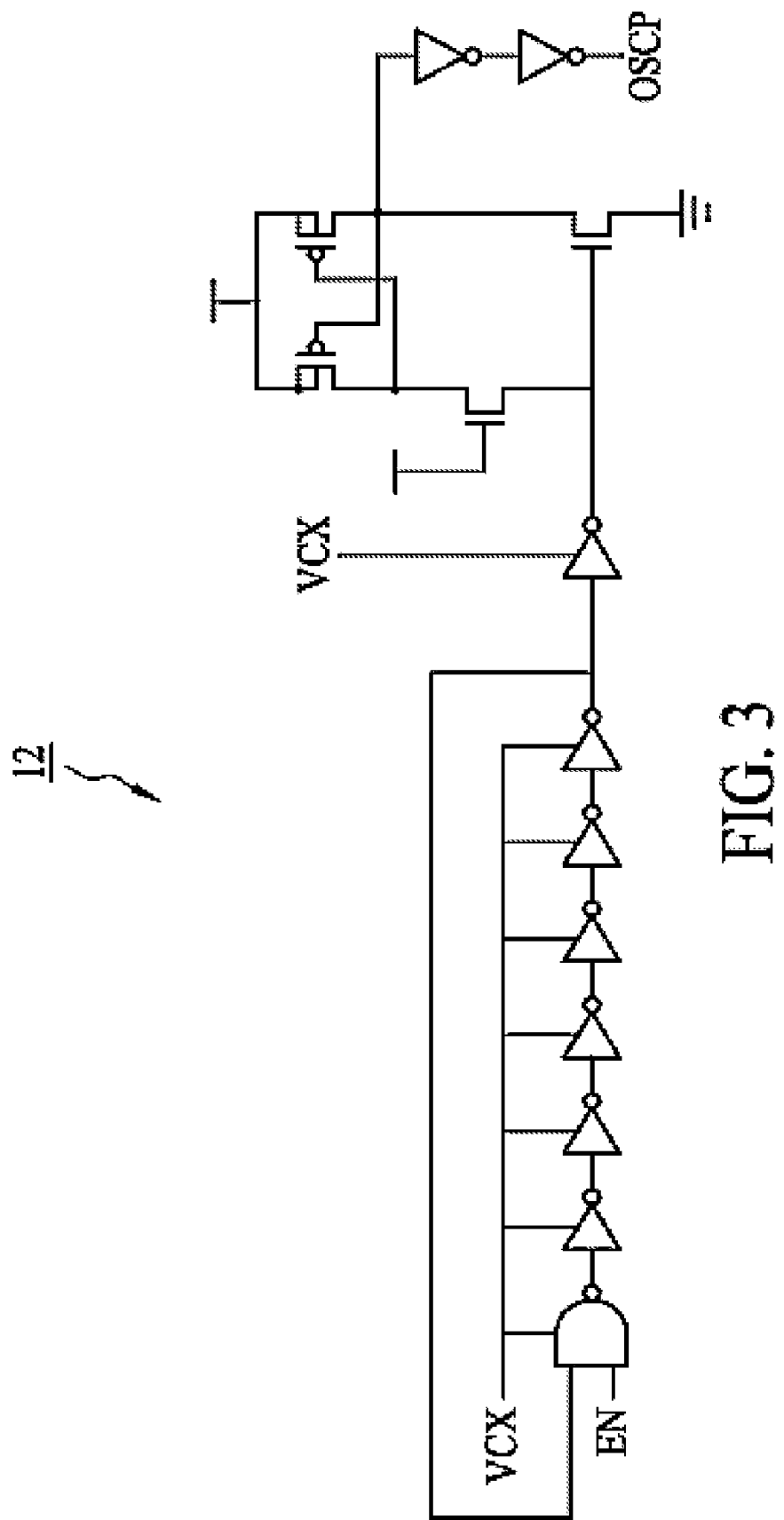
FIG. 3 shows an exemplary circuit of the ring oscillator.

FIG. 3 shows an exemplary circuit of the ring oscillator 12. The signal VCX acts as the voltage supply of the ring oscillator 12, and the signal EN activates the ring oscillator 12. The signal OSCP is the output clock signals of the ring oscillator 12. The higher temperature, the higher the clock rate of the signal OSCP.

Figure 4A:
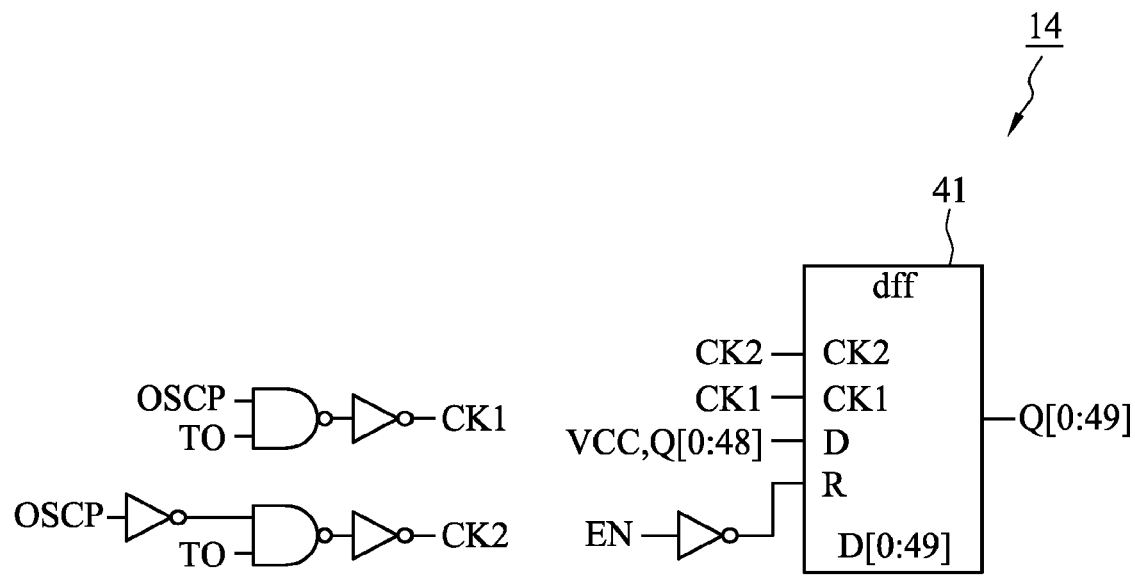
FIGS. 4(a) and 4(b) shows exemplary circuits of the shift register and D-flip flop.
Figure 4B:
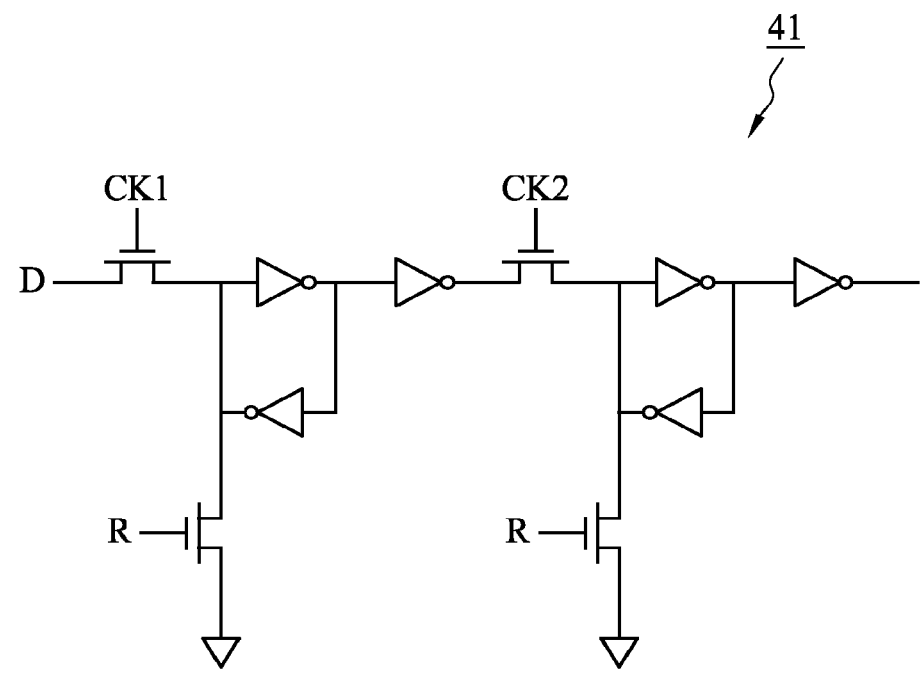

FIG. 4(a) shows a symbol diagram of a D-flip flop (dff) 41, whose schematic diagram is shown in FIG. 4(b). The structure in FIG. 4(a) includes a shift register 14 with 50 D-flip flops 41 connected in series. The first D-flip flop has an input VCC, and its output is sent to the input terminal of the second D-flip flop. The output of the second D-flip flop is sent to the input terminal of the third D-flip flop, and so on. Two clock signals CK1 and CK2, which are generated by combining the signal OSCP and a time-out signal TO, are non-overlapping with each other.

Figure 5A:
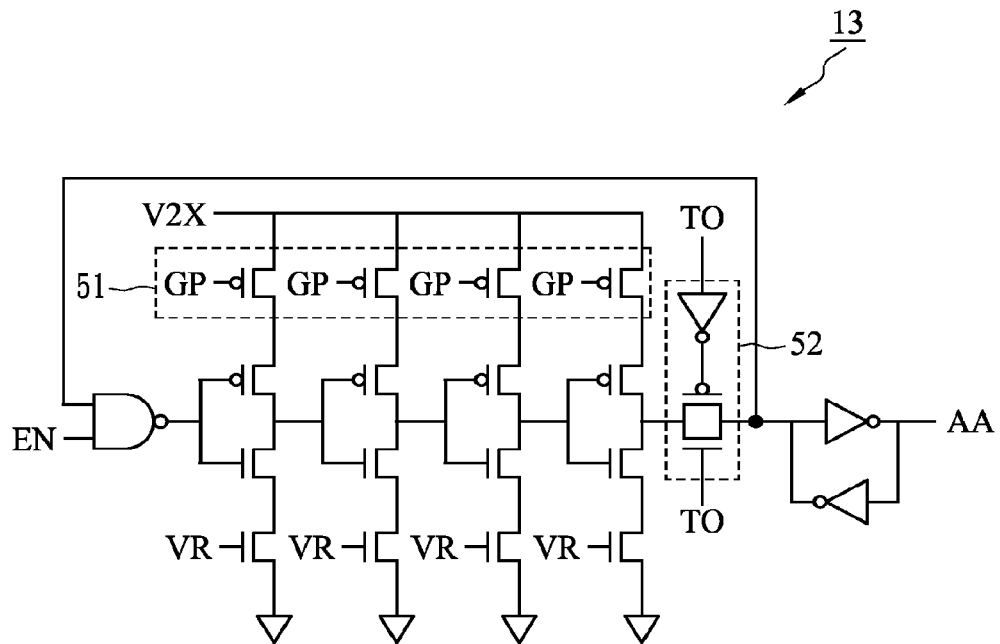
FIGS. 5(a) and 5(b) show exemplary circuits of the timer.
Figure 5B:
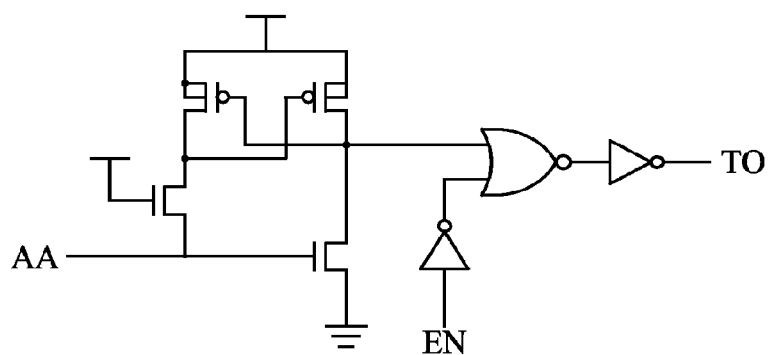

FIG. 5(a) shows an exemplary circuit of the timer 13, where the power V2X is a temperature-independent voltage. The signal GP, which as mentioned above is proportional to the ambient temperature, controls the enablement of the PMOS transistors 51, and the temperature-independent voltage VR controls the enablement of the NMOS transistors. The signal TO, which represents the time-out signal, controls the enablement of the transmission gate 52. In FIG. 5(b), when the output AA of the timer 13 is at logic high, the time-out signal TO will turn to logic low, which means the time-out condition is fulfilled. In other words, the higher temperature is, the more the time-out point generated by the timer 13 will be postponed, which results in more sensitivity of the present invention.

As shown in Table 1, a lower temperature has a longer period of the signal OSCP but a shorter signal TO, and a higher temperature has a shorter period of the signal OSCP but a longer signal TO. Therefore, the sensitivity of actual temperature reading is improved at a high temperature, and power consumption can be effectively reduced at a low temperature.

TABLE 1

| | PTDV | GP | OSCP | TO |
| --- | --- | --- | --- | --- |
| 0° C. | 1.54 V | 0.77 V | 16.9 ns | 94 ns |
| 90° C. | 1.96 V | 0.98 V | 13.2 ns | 500 ns |

As shown in Table 2, Q[n] means the output of the shift register 14, the state of which represents the ambient temperature. For example, Q[4:40] can be utilized to indicate the temperature between 0° C. and 90° C. It is evident that the temperature can be read by counting the number of logic 1 in Q[n] or by decoding it according to the look-up table 15.

TABLE 2

| 0° C. | Q[0:3] = H, Q[4:49] |
| --- | --- |
| 30° C. | Q[0:9] = H, Q[10:49] |
| 60° C. | Q[0:18] = H, Q[19:49] |
| 90° C. | Q[0:40] = H, Q[41:49] |

Figure 6:
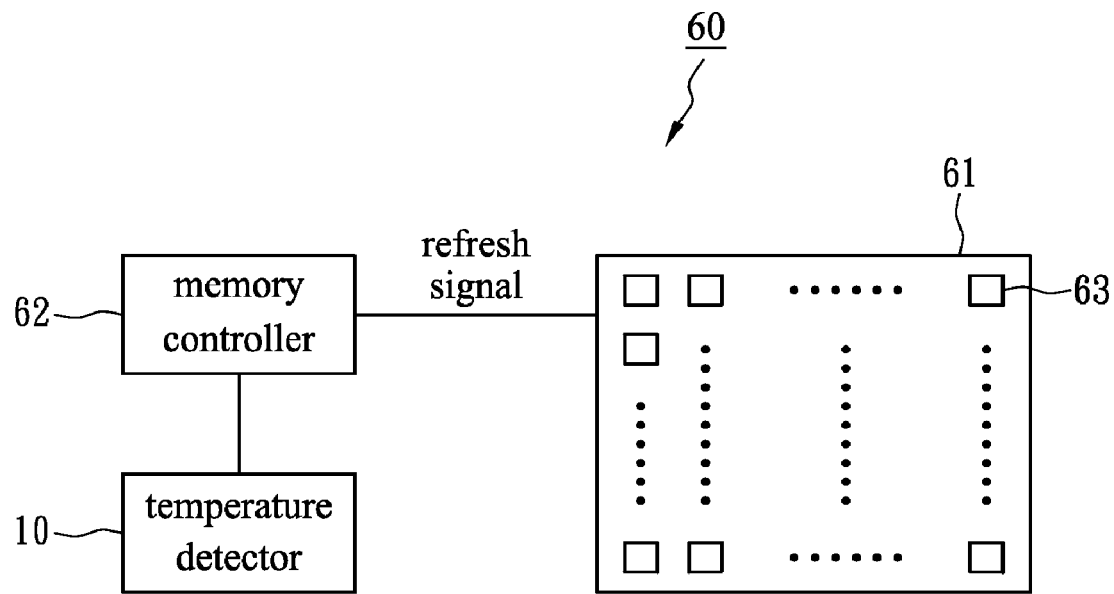
FIG. 6 shows an exemplary DRAM.

FIG. 6 shows an exemplary DRAM. The DRAM 60 includes a memory array 61, a memory controller 62 and a temperature detector 10. The memory array 61 has a plurality of memory cells 63. The memory controller 62 provides a refresh signal to maintain the content of the memory cells 63. The temperature detector is used to determine the ambient temperature, which affects the rate of the refresh signal.

Figure 7:
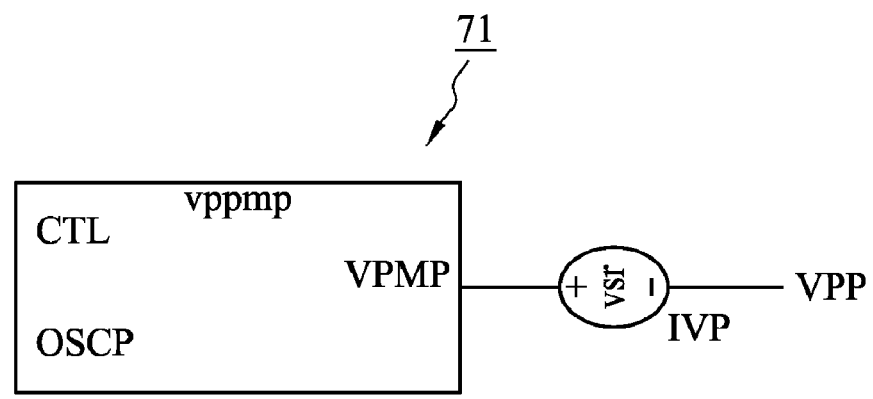
FIG. 7 shows a symbol diagram of a charge pump.

The temperature dependent OSCP can be used as the clock to a charge pump to save the consumption current. FIG. 7 shows a symbol diagram of a charge pump 71, e.g., a Jacksontype charge pump, where the signal CTL represents the enablement signal, and signal OSCP acts as the clock input of the charge pump 71.

Table 3 shows an exemplary relationship between the signals PTDV and OSCP, in which the smaller the signal PTDV the longer the period of the signal OSCP.

TABLE 3

|  | PTDV | OSCP |
| --- | --- | --- |
| 0° C. | 1.53 V | 17.9 ns |
| 90° C. | 1.96 V | 14 ns |

Figure 8A:
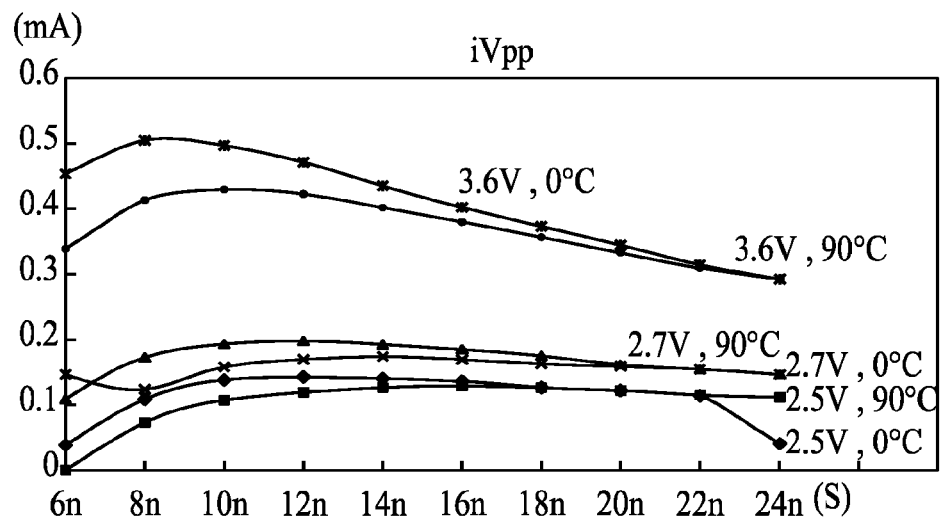
FIGS. 8(a) and 8(b) show the relationship between the pumping current and the period of the signal OSCP.
Figure 8B:
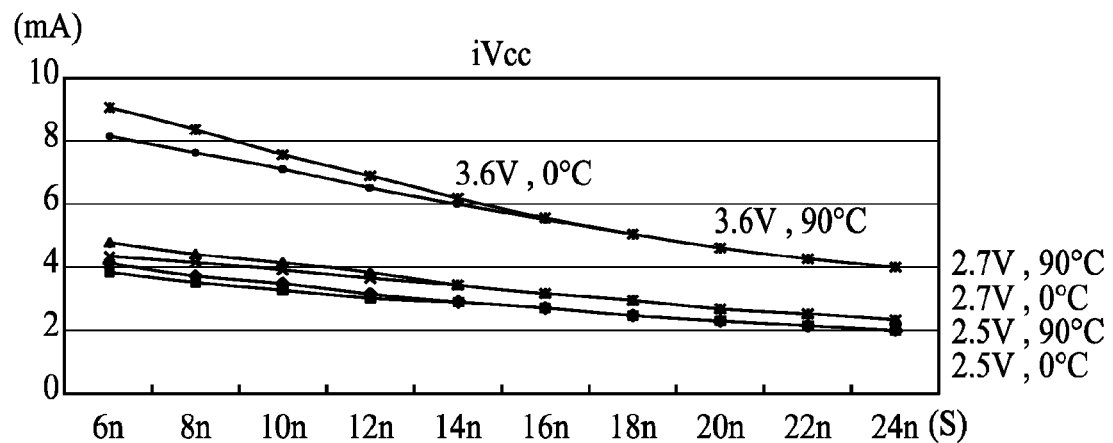

Please refer to FIGS. 8(*a*) and 8(*b*). The maximum pumping current under the condition of 90° C., 2.5V (VPP) occurs when the period of the signal OSCP is 14 ns. But under this condition (OSCP: 14 ns), the pumping current is $$\frac{0.139 \text{ mA}}{0.127 \text{ mA}} = 1.094$$

times than the current at 0° C., 2.5V. At 0° C., the period of the signal OSCP is 18 ns and gets the same pumping current as that at 90° C., but $$iVcc = \frac{2.5 \text{ mA (18 ns period)}}{2.85 \text{ mA (14 ns period)}} = 0.877,$$

which means 13% power is saved. Another example is that at 0° C. and 3.6V, $$\frac{iVcc \text{ (at 18 ns)}}{iVcc \text{ (at 14 ns)}} = \frac{5.1}{6.2} = 0.836,$$

which means 14% power is saved.

The above-described embodiments of the present invention are intended to be illustrative only. Numerous alternative embodiments may be devised by those skilled in the art without departing from the scope of the following claims.

The invention claimed is:

1. A temperature detector comprising:
   a temperature-dependent voltage generator including:
      a primary forward-biased diode providing a temperature-dependent voltage;
      a primary resistor connected between the primary forward-biased diode and a reference node biased to a temperature-independent voltage to produce a primary current;
      a secondary forward-biased diode;
      a secondary resistor connected between the secondary forward-biased diode and an intermediate node;
      a current mirror connected to the intermediate node, the current mirror replicating the primary current through the secondary resistor to amplify the temperature-dependent voltage;
      circuitry configured to generate at least one buffered temperature-dependent voltage from the amplified temperature-dependent voltage;
   a ring oscillator configured to generate a clock signal, wherein a clock rate of the clock signal is affected by the at least one buffered temperature-dependent voltage;
   a timer configured to generate a time-out signal, wherein the time-out signal is affected by the at least one buffered temperature-dependent voltage; and
   a clock driven recorder having a clock input, wherein the clock input is in response to the clock signal and time-out signal, and the clock-driven recorder is used to estimate a temperature reading.

2. A temperature-dependent charge pump comprising:
   a temperature-dependent voltage generator including:
      a primary forward-biased diode providing a temperature-dependent voltage;
      a primary resistor connected between the primary forward-biased diode and a reference node biased to a temperature-independent voltage to produce a primary current;
      a secondary forward-biased diode;
      a secondary resistor connected between the secondary forward-biased diode and an intermediate node;
      a current mirror connected to the intermediate node, the current mirror replicating the primary current through the secondary resistor to amplify the temperature-dependent voltage;
   circuitry configured to generate at least one buffered temperature-dependent voltage from the amplified temperature-dependent voltage;
   a ring oscillator configured to generate a clock signal, wherein a clock rate of the clock signal is affected by the at least one buffered temperature-dependent voltage; and
   a charge pump providing a temperature-dependent output in response to the clock signal.

3. The temperature-dependent charge pump of claim 2, wherein a voltage of the temperature-dependent output increases with increased temperature.

4. The temperature-dependent charge pump of claim 2, wherein a voltage of the temperature-dependent output decreases with decreased temperature.

5. The temperature-dependent charge pump of claim 2, wherein a secondary resistor value of the secondary resistor is larger than a primary resistor value of the primary resistor, the primary forward-biased diode is an emitter-base diode of a primary bipolar transistor, a collector-base diode of the primary bipolar transistor is shunted, the secondary forward-biased diode is an emitter-based diode of a secondary bipolar transistor, and the collector-base diode of the secondary bipolar transistor is shunted.

6. The temperature detector of claim 1, wherein a secondary resistor value of the secondary resistor is larger than a primary resistor value of the primary resistor.

7. The temperature detector of claim 1, wherein the primary forward-biased diode is an emitter-base diode of a primary bipolar transistor, a collector-base diode of the primary bipolar transistor is shunted, the secondary forward-biased diode is an emitter-based diode of a secondary bipolar transistor, and the collector-base diode of the secondary bipolar transistor is shunted.

8. The temperature detector of claim 1, wherein a frequency of the ring oscillator increases with increased temperature, a duration between the time-out signal and a subsequent time out signal increases with increased temperature, and the clock driven recorder estimates a temperature reading with more precision with increased temperature.

9. The temperature detector of claim 1, wherein the clock-driven recorder is a shift register.

10. The temperature detector of claim 1, wherein the clock-driven recorder is a counter.

11. The temperature detector of claim 1, further comprising a look-up table for use in decoding a content of the clock-driven recorder.

12. A memory comprising:
a plurality of memory cells;
a memory controller providing a refresh signal to maintain a content of the memory cells;
and a temperature detector according to claim 1, wherein the temperature detector is used to determine a rate at which the memory controller provides refresh signals.

13. The memory of claim 12, wherein the memory is a random access memory.

14. The memory of claim 12, wherein the memory is a non-volatile memory.

15. The memory of claim 12, wherein the clock-driven recorder is a shift register.

16. The memory of claim 12, wherein the clock-driven recorder is a counter.

17. The memory of claim 12, further comprising a look-up table for use in decoding a content of the clock-driven recorder.

18. A computer comprising:
a one or more computational units in communication with each other;
a temperature-dependent voltage generator including;
a primary forward-biased diode providing a temperature-dependent voltage;
a primary resistor connected between the primary forward-biased diode and a reference node biased to a temperature-independent voltage to produce a primary current;
a secondary forward-biased diode;
a secondary resistor connected between the secondary forward-biased diode and an intermediate node;
a current mirror connected to the intermediate node, the current mirror replicating the primary current through the secondary resistor to amplify the temperature-dependent voltage;
circuitry configured to generate an at least one temperature-dependent voltage from the amplified temperature-dependent voltage; and
a ring oscillator configured to generate a clock signal, wherein a clock rate of the clock signal is affected by the at least one buffered temperature-dependent voltage, and the clock signal is used to sequence one or more computers.

19. The computer of claim 18, wherein the clock rate decreases with increased temperature.

20. The computer of claim 18, wherein the computer is in an integrated circuit.

* * * * *